(12) United States Patent
Kang et al.

(10) Patent No.: US 7,737,527 B2
(45) Date of Patent: Jun. 15, 2010

(54) PHASE CHANGE MATERIAL CONTAINING CARBON, MEMORY DEVICE INCLUDING THE PHASE CHANGE MATERIAL, AND METHOD OF OPERATING THE MEMORY DEVICE

(75) Inventors: Youn-seon Kang, Seoul (KR); Dong-seok Suh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 162 days.

(21) Appl. No.: 12/073,400

(22) Filed: Mar. 5, 2008

(65) Prior Publication Data
US 2009/0021977 A1  Jan. 22, 2009

(30) Foreign Application Priority Data
Jul. 20, 2007  (KR) ............... 10-2007-0073114

(51) Int. Cl.
*H01L 29/00* (2006.01)
(52) U.S. Cl. ............... 257/529; 257/537; 257/E27.016; 257/E27.047

(58) Field of Classification Search ................. 257/529, 257/537, E27.016, E27.047
See application file for complete search history.

(56) References Cited

U.S. PATENT DOCUMENTS

| 7,166,346 B2 * | 1/2007 | Kim et al. | 428/64.4 |
| 7,223,450 B2 * | 5/2007 | Taugerbeck et al. | 428/1.1 |
| 7,642,540 B2 * | 1/2010 | Lee et al. | 257/4 |
| 2005/0099934 A1 * | 5/2005 | Kondo et al. | 369/275.4 |

* cited by examiner

*Primary Examiner*—Ngan Ngo
(74) *Attorney, Agent, or Firm*—Harness, Dickey & Pierce, PLC

(57) ABSTRACT

Provided are a phase change material containing carbon (C), a memory device including the phase change material, and a method of operating the memory device. The phase change material contains a main compound and an additive, wherein the main compound is In—Sb—Te and the additive includes carbon (C). A content a of the carbon (C) may be $0.005 \leq a \leq 0.30$ atomic (at) %. The additive may further contain nitrogen (N), oxygen (O), boron (B), or a transition metal. The additive may include carbide instead of the carbon (C).

19 Claims, 10 Drawing Sheets

PHASE CHANGE MATERIAL CONTAINING CARBON, MEMORY DEVICE INCLUDING THE PHASE CHANGE MATERIAL, AND METHOD OF OPERATING THE MEMORY DEVICE

CROSS-REFERENCE TO RELATED PATENT APPLICATION

This application claims the benefit of Korean Patent Application No. 10-2007-0073114, filed on Jul. 20, 2007, in the Korean Intellectual Property Office, the disclosure of which is incorporated herein in its entirety by reference.

BACKGROUND OF THE INVENTION

1. Field of the Invention

The present invention relates to a memory material and a memory device including the memory material, and more particularly, to a phase change material containing carbon (C), a memory device including the phase change material, and a method of operating the memory device.

2. Description of the Related Art

A phase change random access memory (PRAM) is a nonvolatile memory device and has advantages of a dynamic random access memory (DRAM) that is a representative volatile memory device.

A characteristic of a PRAM is that a storage node in which data is stored includes a phase change layer that is changed between an amorphous state and a crystalline state in accordance with temperature variations.

A commonly-used phase change layer of a PRAM is a $Ge_2Sb_2Te_5$ layer (hereinafter, referred to as a GST layer). A GST layer has a low crystallization temperature (Tc) of 160° C. and thus a set current (Iset) is low.

Due to the fact that the distance between adjacent unit memory cells of a PRAM is getting smaller as the integration density of memory devices is increasing, if the Tc is low, when a selected cell is crystallized, a neighboring cell may be affected. That is, cell disturbance may occur. Cell disturbance may damage data written in an unselected cell and thus may deteriorate reliability of data. Also, if the Tc of the phase change layer is low, a retention characteristic or an infrared (IR) reflow characteristic may be poor.

Meanwhile, a melting temperature (Tm) of the GST layer at which the GST layer is changed from the crystalline state to the amorphous state is a relatively high temperature of 620° C. Thus, if the PRAM uses the GST layer as the phase change layer, a current for changing the phase change layer from the crystalline state to the amorphous state, in other words, a current for writing data, that is, a reset current (Ireset), may be relatively high.

In order to overcome the above disadvantage of the GST layer, an $In_3Sb_1Te_2$ layer may be used as the phase change layer. In comparison to a GST layer, an $In_3Sb_1Te_2$ layer has advantages as described below.

First, an $In_3Sb_1Te_2$ layer has a Tc of 265° C. that is more than 100° C. higher than the Tc of a GST layer and thus thermal stability and retention characteristics of a PRAM including an $In_3Sb_1Te_2$ layer as the phase change layer may be improved in comparison to a case when a GST layer is used.

Second, an $In_3Sb_1Te_2$ layer has a relatively low Tm of 560° C. and thus the Ireset may be lowered.

Third, an $In_3Sb_1Te_2$ layer has a high resistance in an amorphous state and a low resistance in a crystalline state and thus a sensing margin may be increased.

Fourth, a crystal structure of the $In_3Sb_1Te_2$ layer is face-centered cubic (FCC) such that the phase change rate is fast. Thus, operating speed of a PRAM including the $In_3Sb_1Te_2$ layer may be increased.

In spite of these advantages, the $In_3Sb_1Te_2$ layer may be easily resolved into (InTe)2+(InSb)1 by a peritectic reaction. Thus, a single phase may not be easily formed and even if a single phase is formed, phase separation may easily occur.

As a result, in spite of its many advantages as the phase change layer of a PRAM, a conventional $In_3Sb_1Te_2$ layer may not be easily applied to a PRAM.

SUMMARY OF THE INVENTION

The present invention provides a phase change material in which thermal stability may be ensured, a reset current (Ireset) may be lowered, and a single phase may be maintained.

The present invention also provides a memory device including the phase change material.

The present invention also provides a method of operating the memory device.

According to an aspect of the present invention, there is provided a phase change material containing a main compound and an additive, wherein the main compound is indium-antimony-tellurium (IST) and the additive includes carbon (C).

A content a of the carbon (C) may be $0.005 \leq a \leq 0.30$ atomic (at) %.

The additive may further include nitrogen (N), oxygen (O), boron (B), or a transition metal.

The additive may include carbide instead of the carbon (C).

The amount of the carbon (C) may be such that the phase change material is maintained to be a single phase.

The indium (In) may be replaced by a Group-3 element.
The antimony (Sb) may be replaced by a Group-5 element.
The tellurium (Te) may be replaced by a Group-6 element.

According to another aspect of the present invention, there is provided a memory device including a switching device and a storage node connected to the switching device, wherein the storage node includes a phase change layer including an indium-antimony-tellurium (IST) layer and an additive for maintaining the IST layer to be a single phase.

The additive may include any one of carbon (C) and carbide. The additive may further include nitrogen (N), oxygen (O), boron (B), or a transition metal.

The storage node may include a lower electrode which is connected to the switching device; a lower electrode contact layer which is formed on the lower electrode; the phase change layer which covers an upper surface of the lower electrode contact layer; and an upper electrode which is formed on the phase change layer.

According to another aspect of the present invention, there is provided a method of operating the above memory device, the method including turning on the switching device; and applying an operating voltage to the storage node.

The operating voltage may be any one of a data write voltage, a data read voltage, and a data erase voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
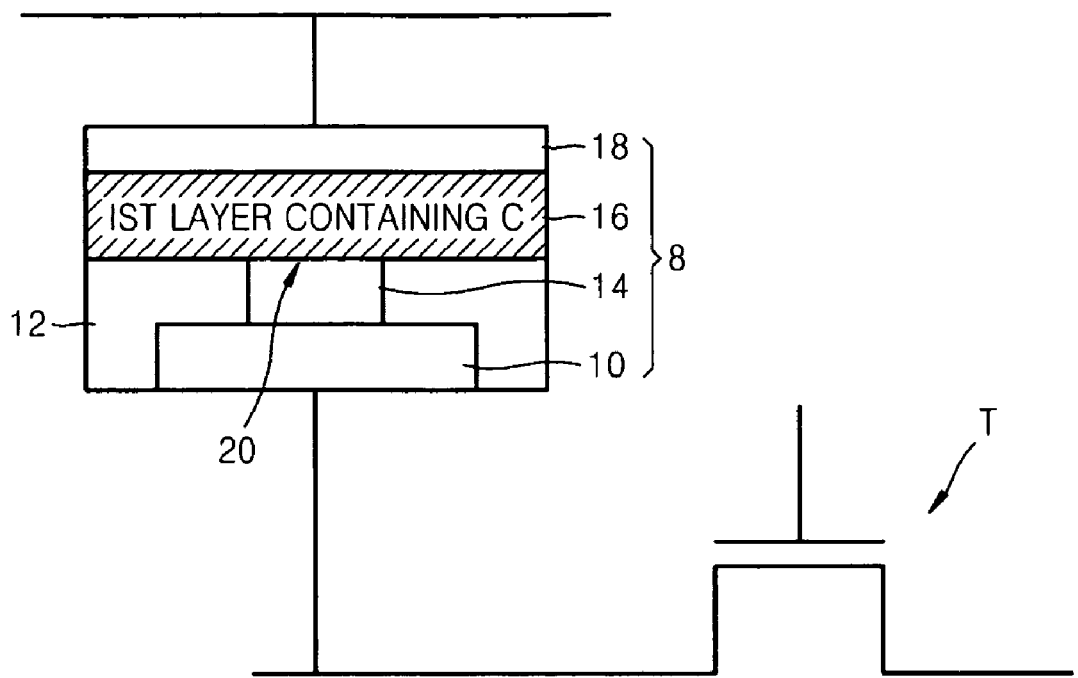
FIG. 1 is a diagram illustrating a structure of a memory device including a phase change layer containing carbon (C), according to an embodiment of the present invention.

Hereinafter, a phase change material containing carbon (C), a memory device including a phase change layer formed of the phase change material, and a method of operating the memory device, according to embodiments of the present invention will be described in detail with reference to the attached drawings. In the drawings, the thicknesses of layers and regions are exaggerated for clarity. The phase change material containing C will be described while the memory device is being described.

FIG. 1 is a diagram illustrating a structure of a memory device including a phase change layer containing C, according to an embodiment of the present invention.

Referring to FIG. 1, the memory device according to the current embodiment of the present invention includes a transistor T and a storage node 8 that is connected to the transistor T. The transistor T functions as a switching device in the current embodiment. However, the present invention is not limited thereto, and another switching device such as a diode may also be used instead of the transistor T. The storage node 8 is a portion where data is written and includes a lower electrode 10, a lower electrode contact layer 14, a phase change layer 16, and an upper electrode 18. The lower electrode contact layer 14 has a smaller diameter than the lower electrode 10 and connects the lower electrode 10 to the phase change layer 16. The lower electrode 10 and the lower electrode contact layer 14 are covered by an interlayer insulating layer 12. A contact portion 20 of the phase change layer 16 which contacts the lower electrode contact layer 14 is changed from a crystalline state to an amorphous state by a reset current (Ireset) applied to the memory device in order to write data. Also, the contact portion 20 is changed from the amorphous state to a crystalline state by a set current (Iset) applied to the memory device in order to erase the data. The Iset is lower than the Ireset. The phase change layer 16 may be an indium-antimony-tellurium (IST) compound layer containing C (hereinafter, referred to as a C-IST layer) such as an $In_3Sb_1Te_2$ layer containing C. A C content a of the C-IST layer may be $0.005 \leq a \leq 0.30$ atomic (at) %. In this case, indium (In) content b, antimony (Sb) content c, and tellurium (Te) content d of the C-IST layer may be $0 \leq b \leq 0.60$ at %, $0 \leq c \leq 0.60$ at %, and $0 \leq d \leq 0.60$ at %, respectively.

The C-IST layer may further contain nitrogen (N), oxygen (O), boron (B), or a transition metal. Also, the C-IST layer may contain carbide instead of C. The carbide may be silicon carbide or transition metal carbide. If the C-IST layer contains carbide instead of C, the C-IST layer may also further contain N, O, B, or a transition metal.

Meanwhile, in the C-IST layer, the In may be replaced by a Group-3 element such as aluminium (Al) or gallium (Ga), the Sb may be replaced by a Group-5 element such as arsenic (As) or bismuth (Bi), and the Te may be replaced by a Group-6 element such as sulfur (S) or selenium (Se).

The C-IST layer may be formed using a co-sputtering method, an ion injection method, an evaporation method, a molecular-beam epitaxy method, a chemical vapor deposition (CVD) method, or an atomic layer deposition (ALD) method.

Then, the inventor of the present invention performed a test of measuring state variations in a C-IST layer, a GST layer, and an IST layer not containing C in accordance with temperature variations in order to demonstrate excellent performance of the C-IST layer.

In the test, first through third C-IST layers having different C contents, a GST layer, and an IST layer not containing C, that is, a pure IST layer were prepared. Here, a $SiO_2$/Si substrate was used as a substrate on which each phase change layer was formed. The C contents of the first through third C-IST layers were increased from the first C-IST layer to the third C-IST layer. The C content of the third C-IST layer was about 8.8 at %.

The first through third C-IST layers were formed using a radio frequency (RF) magnetron co-sputtering apparatus including a C sputtering target and an $In_3Sb_1Te_2$ sputtering target. The C contents of the first through third C-IST layers were controlled by varying the RF power applied to each target. Thus, if the RF magnetron co-sputtering apparatus does not apply the RF power to the C sputtering target, the pure IST layer may be formed.

FIGS. 2 through 14 are graphs and photographic images showing results of the test, according to embodiments of the present invention.

FIGS. 2 through 6 are graphs showing diffraction analysis results on the first through third C-IST layers and the pure IST layer, according to embodiments of the present invention.

In FIGS. 2 through 6, Pure IST indicates a result with respect to the pure IST layer, and C-IST#01, C-IST#02, and C-IST#03 respectively indicate results with respect to the first through third C-IST layers.

Figure 2:
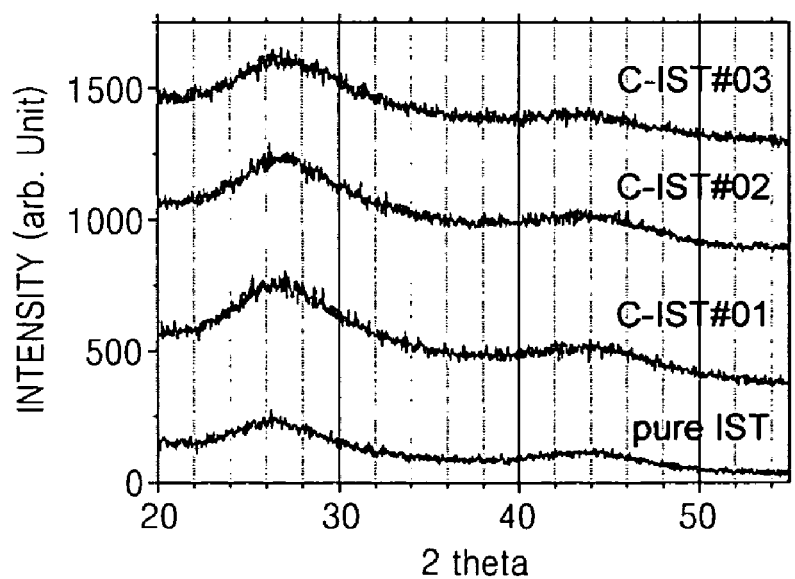
FIGS. 2 through 14 are graphs (FIGS. 2 through 6 and 12 through 14) and microscopic images (FIGS. 7 through 11) showing test results representing characteristics of phase change layers containing C which are applied to a memory device, according to embodiments of the present invention.

FIG. 2 is a graph showing a diffraction analysis result when the pure IST layer and the first through third C-IST layers were formed at a room temperature.

Referring to FIG. 2, an obvious peak does not occur in any of Pure IST, C-IST#01, C-IST#02, and C-IST#03. Due to the result of FIG. 2, it is clear that the pure IST layer and the first through third C-IST layers are all amorphous right after deposition.

Figure 3:
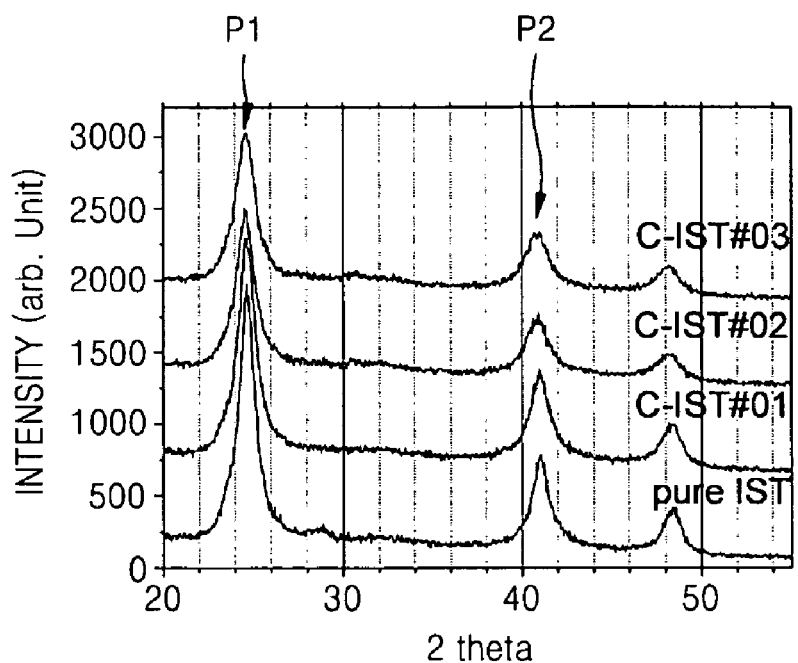

FIG. 3 is a graph showing a diffraction analysis result when the pure IST layer and the first through third C-IST layers were annealed for two minutes at 300° C. in a nitrogen atmosphere after deposition.

Referring to FIG. 3, a first peak P1 occurs where 2 theta (θ) is approximately 25° and a second peak P2 occurs where 2θ is approximately 41°. The first and second peaks P1 and P2 indicate that the pure IST layer and the first through third C-IST layers are all crystalline. The first peak P1 corresponds to a (111) plane of an IST layer having a face-centered cubic (FCC) structure.

Figure 4:
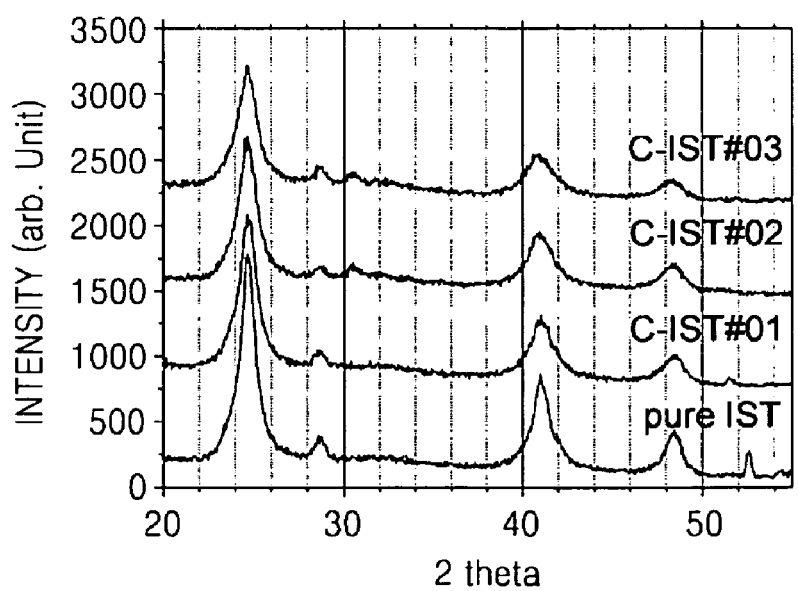

FIG. 4 is a graph showing a diffraction analysis result when the pure IST layer and the first through third C-IST layers were annealed for two minutes at 340° C. in a nitrogen atmosphere after deposition.

Referring to FIG. 4, the result of FIG. 4 is not different from the result of FIG. 3. Accordingly, it is clear that the pure IST layer and the first through third C-IST layers are all equally crystalline if the pure IST layer and the first through third C-IST layers are annealed at 300° C. or 340° C. after deposition.

Figure 5:
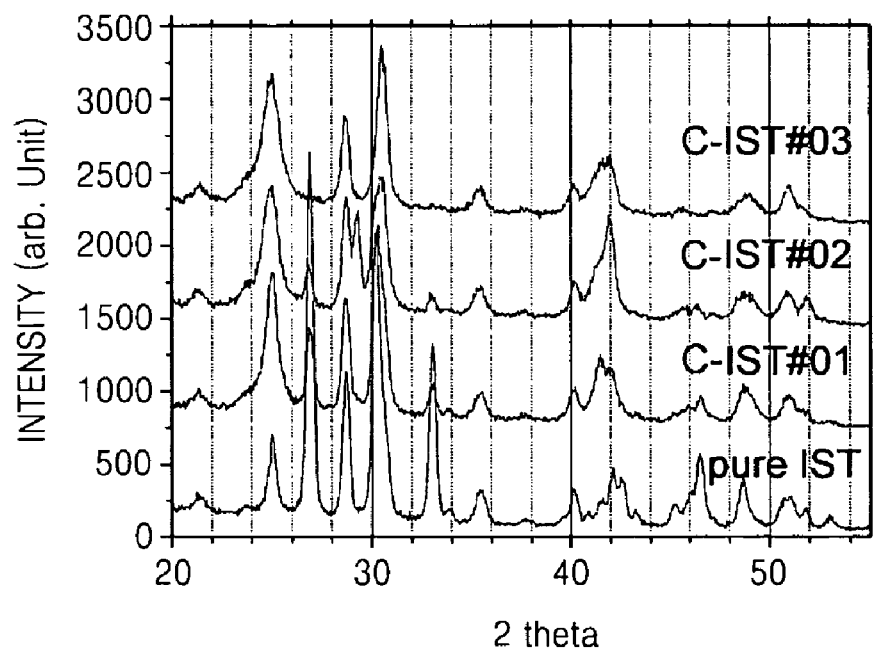
Figure 6:
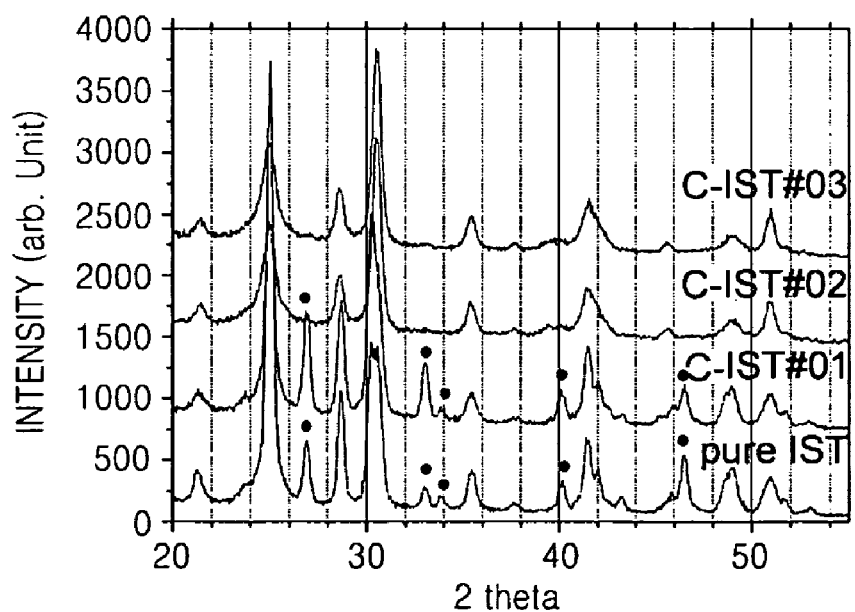

FIG. 5 is a graph showing a diffraction analysis result when the pure IST layer and the first through third C-IST layers were annealed using a rapid thermal annealing (RTA) method for two minutes at 380° C. in a nitrogen atmosphere after deposition. FIG. 6 is a graph showing a diffraction analysis result when the pure IST layer and the first through third C-IST layers were annealed using an RTA method for two minutes at 420° C. in a nitrogen atmosphere after deposition.

Referring to FIGS. 5 and 6, in the pure IST layer and the first C-IST layer, new peaks occur where 2θ is approximately 27°, 33°, 34°, 40°, and 46.5°. Dots illustrated in FIG. 6 represent the new peaks.

The new peaks correspond to (211), (202), and (310) planes of InTe having a tetragonal structure, a (101) plane of InSb having an orthorhombic structure, and (220) and (311) planes of InSb having a FCC structure.

From the graphs of FIGS. 5 and 6, it is clear that the pure IST layer and the first C-IST layer have a mixed multi-phase in which a plurality of phases are mixed, instead of a single phase. The mixed multi-phase causes an IST layer to be separated into InTe and InSb due to a peritectic reaction.

Meanwhile, in FIGS. 5 and 6, the new peaks occurring in the pure IST layer and the first C-IST layer do not occur in the second and third C-IST layers.

Considering that the first C-IST layer and the second and third C-IST layers differ in the content of carbon contained therein, an IST layer containing more than a certain amount of C has a stable crystal structure due to inhibition of the peritectic reaction and thus the IST layer may be maintained to be a single phase.

Figure 7:
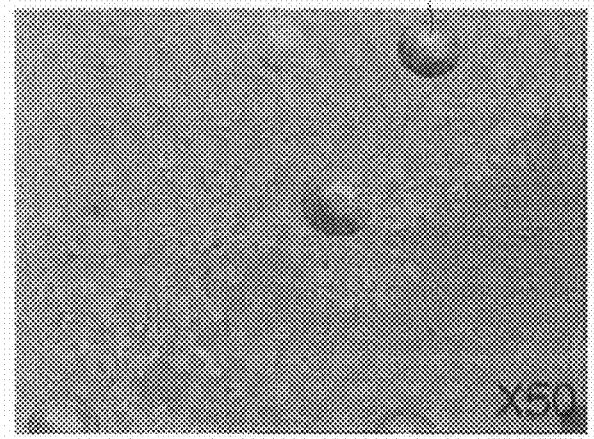
Figure 8:
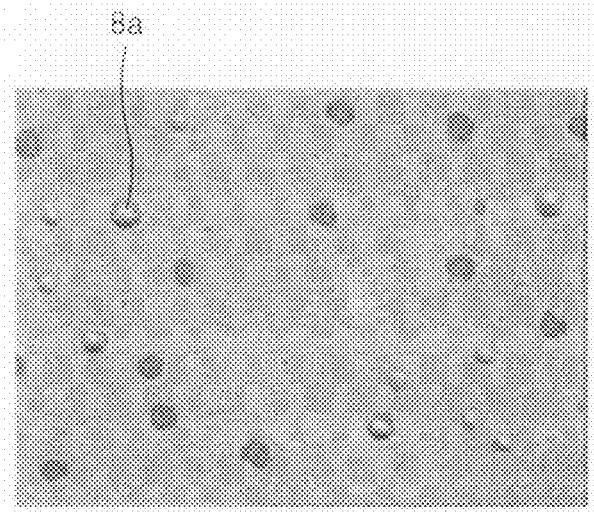
Figure 9:
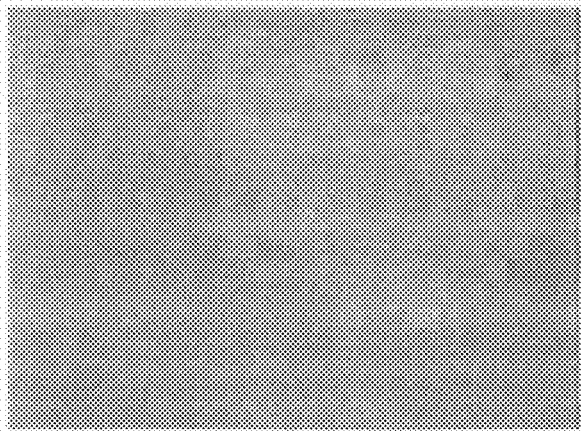

FIGS. 7 through 9 are optical microscopic images respectively showing surfaces of the first through third C-IST layers which were used to obtain the result of FIG. 5, according to embodiments of the present invention.

Referring to FIGS. 7 and 8, blisters 7a and 8a are formed on the surfaces of the first and second C-IST layers.

In particular, in FIG. 7, sizes of the blisters 7a are large and an exfoliation phenomenon occurs. In FIG. 8, sizes of the blisters 8a are not large and the exfoliation phenomenon does not occur. However, there are a large number of the blisters 8a, a large proportion of which are volatilized.

On the other hand, referring to FIG. 9, blisters are not formed on the surface of the third C-IST layer and the exfoliation phenomenon does not occur.

Figure 10:
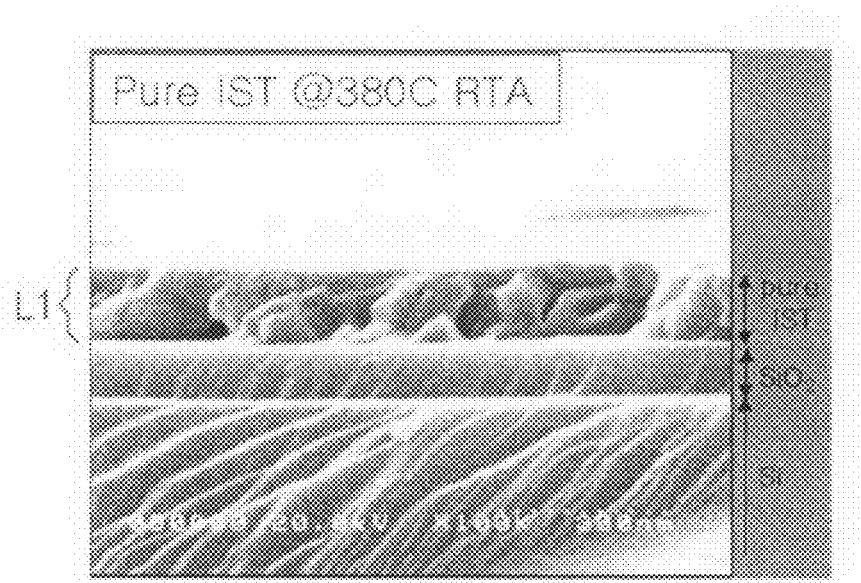
Figure 11:
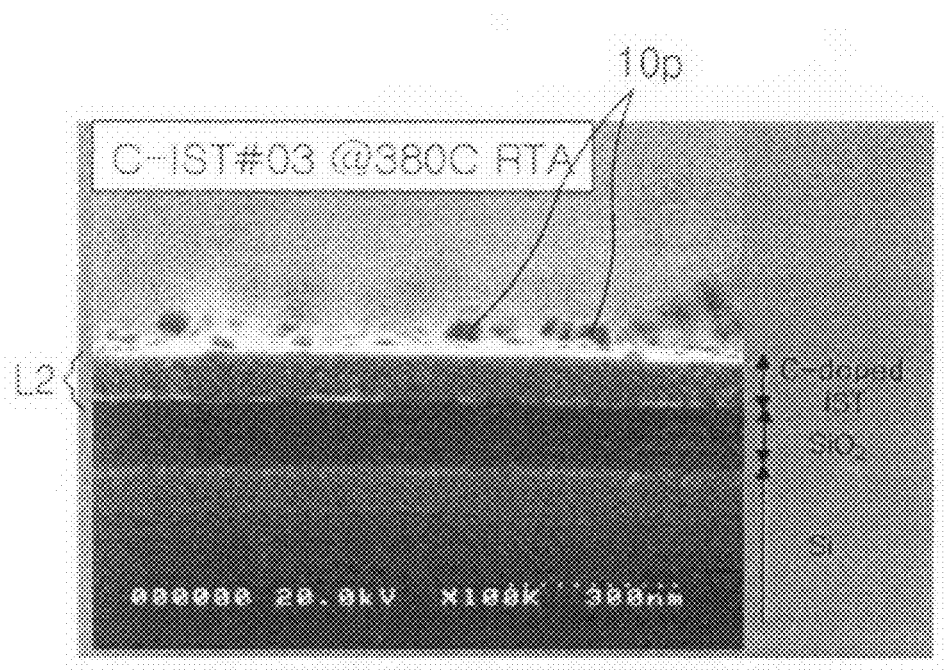

FIGS. 10 and 11 are scanning electron microscopic (SEM) images respectively showing cross sections of a pure IST layer L1 and a third C-IST layer L2 which were annealed for two minutes at 380° C. in a nitrogen atmosphere by using an RTA method, according to embodiments of the present invention.

The thickness of the pure IST layer L1 in FIG. 10 is approximately 1200 Å and the thickness of the third C-IST layer L2 in FIG. 11 is approximately 900 Å.

Referring to FIG. 10, the cross section of the pure IST layer L1 is very porous. The porous cross section is regarded to be a result of the above-described phase separation, condensation into blisters, exfoliation phenomenon, and volatilization.

On the other hand, referring to FIG. 11, the third C-IST layer L2 has a uniform thickness and is very dense. Accordingly, the crystal structure of the third C-IST layer L2 is regarded as being stable and such result is identical to the above-described diffraction analysis results or results predicted from the optical microscopic analysis.

In FIG. 11, impurities 10p disposed on the third C-IST layer L2 were not generated when the third C-IST layer L2 was formed but were dropped on a surface of the third C-IST layer L2 while a sample including the third C-IST layer for the SEM image was being made.

Figure 12:
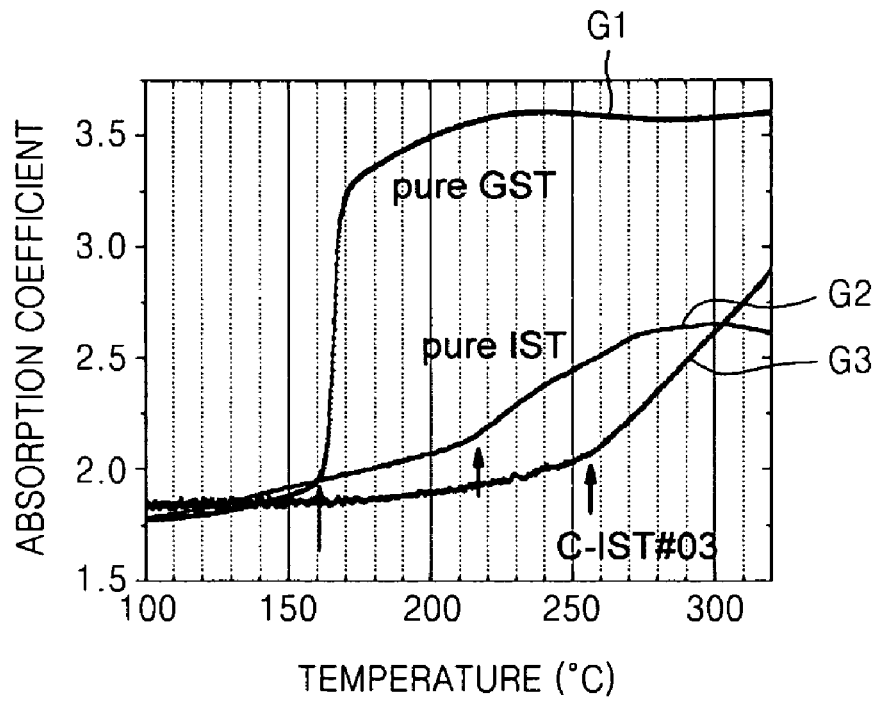
Figure 13:
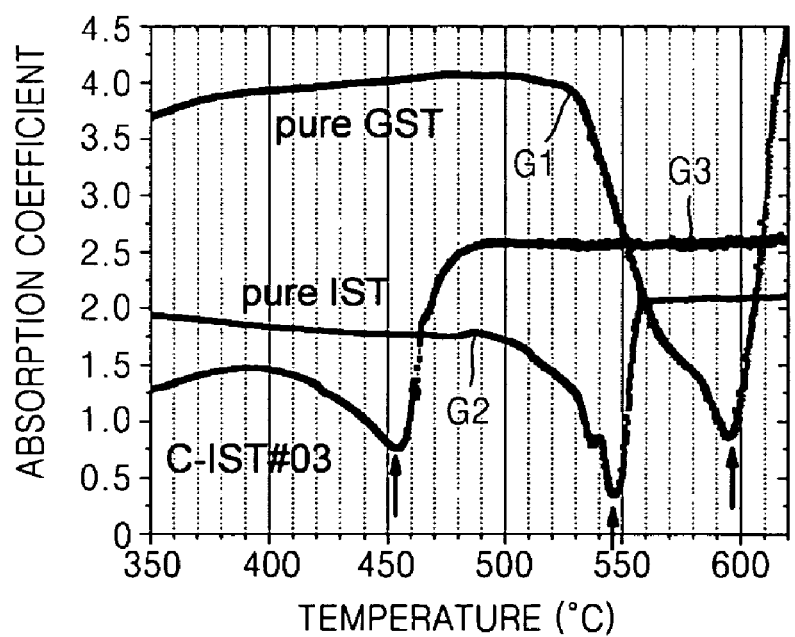

FIGS. 12 and 13 are graphs showing analysis results representing phase change characteristics of a pure IST layer, a third C-IST layer, and a GST layer, according to embodiments of the present invention.

The analysis results shown in FIGS. 12 and 13 are obtained using a temperature dependent ellipsometry method. In order to obtain the analysis results, samples of the pure IST layer, the third C-IST layer, and the GST layer were disposed in separate holders and variations in a dielectric constant of each sample were checked by increasing temperature from room temperature to 700° C. by 10° C. every ten minutes. Here, a helium (He)-neon (Ne) laser having a wavelength of 620 nm was used.

In FIG. 12, temperatures at which absorption coefficients radically change are indicated by arrows which indicate temperatures, that is, crystallization temperatures (Tcs) at which a phase of each sample was changed from an amorphous state to a crystalline state.

Referring to FIG. 12, a Tc of the GST layer (see a first graph G1) used as a reference layer is 160° C. as already known and the Tc of the pure IST layer (see a second graph G2) is 218° C. However, the Tc of the third C-IST layer (see a third graph G3) is 255° C. that is much higher than the Tc of the pure IST layer.

From the graph of FIG. 12, it is clear that thermal stability of a phase change random access memory (PRAM) according to an embodiment of the present invention is higher than the thermal stability of a conventional PRAM. Thus, the PRAM according to an embodiment of the present invention may not be affected by cell disturbance occurring due to heat.

FIG. 13 is a graph showing melting temperatures (Tms) of the samples. In FIG. 13, the Tms, indicated by arrows, are temperatures at which absorption coefficients radically increase.

Referring to FIG. 13, the Tm of the GST layer (see a first graph G1) is approximately 600° C. and the Tm of the pure IST layer (see a second graph G2) is approximately 550° C. However, the Tm of the third C-IST layer (see a third graph G3) is approximately 450° C. that is much lower than the Tm of the pure IST layer as well as the Tm of the GST layer.

The result of FIG. 13 implies that a PRAM using the third C-IST layer as the phase change layer 16 illustrated in FIG. 1, according to an embodiment of the present invention, may ensure structural and thermal stabilities and may reduce an Ireset as well.

Figure 14:
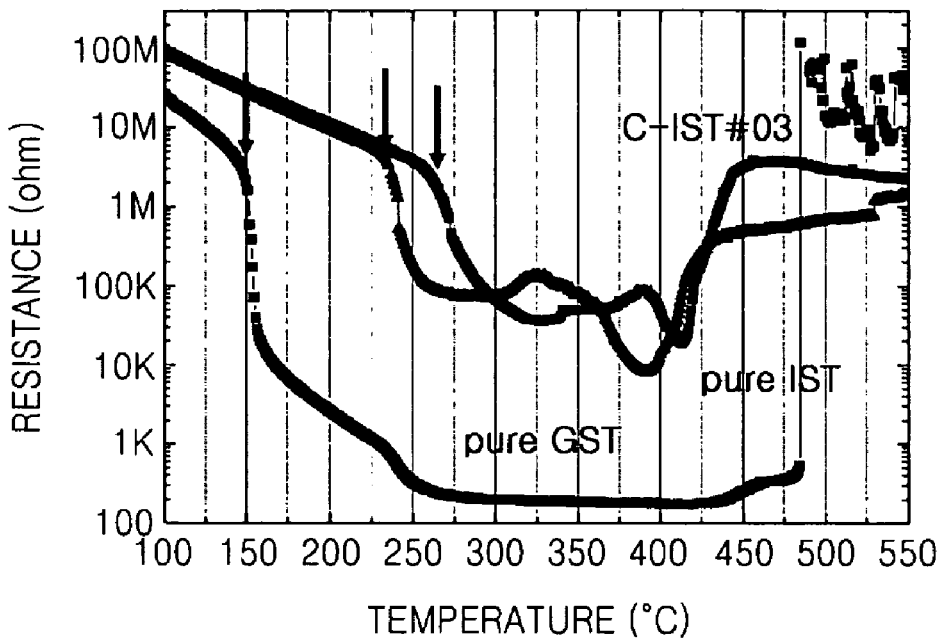

FIG. 14 is a graph showing an analysis result representing resistance variations in a pure IST layer, a third C-IST layer, and a GST layer in accordance with temperature variations by using a temperature dependent 4-point probe method, according to embodiments of the present invention.

Referring to FIG. 14, an electrical resistance of each layer is reduced at a temperature, that is, a Tc at which each layer is changed from an amorphous state to a crystalline state. Arrows indicate Tcs. The Tc of each layer is identical to the optical analysis result of FIG. 11. In the crystalline state, the resistance of the third C-IST layer is approximately two orders higher than the resistance of the GST layer. Due to radical changes of electrical resistance which occur near the Tcs, it is clear that the third C-IST layer is suitable for use as a phase change layer in a PRAM requiring high speed operations.

FIGS. 15 through 18 are cross-sectional diagrams illustrating a method of manufacturing a memory device, according to an embodiment of the present invention.

Figure 15:
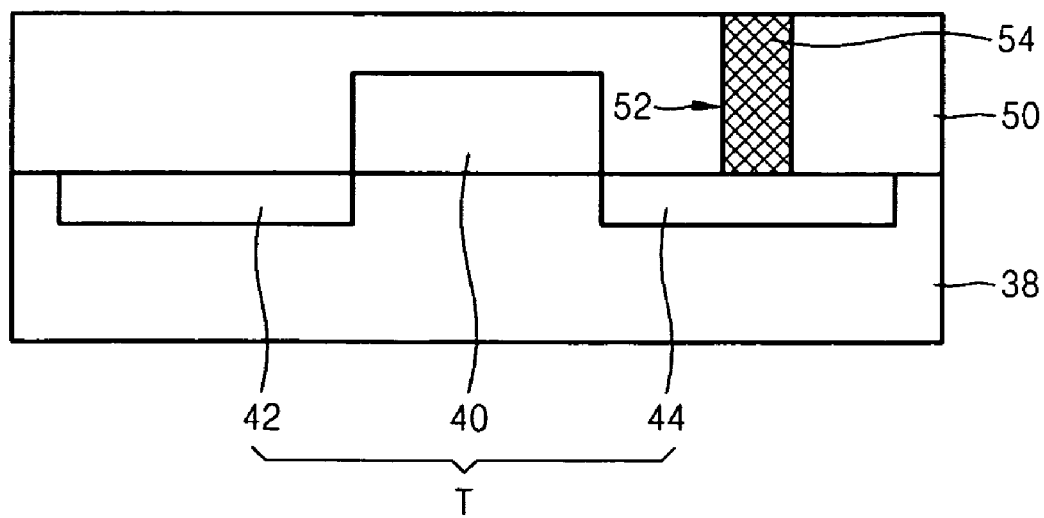
FIGS. 15 through 18 are cross-sectional diagrams illustrating a method of manufacturing a memory device, according to an embodiment of the present invention.

Referring to FIG. 15, a transistor T is formed by forming a gate 40 on a substrate 38 and first and second impurity regions 42 and 44 in the substrate 38. Any one of the first and second impurity regions 42 and 44 may be a source region and the other may be a drain region. A first interlayer insulating layer 50 is formed on the substrate 38 so as to cover the transistor T. The first interlayer insulating layer 50 may be a conventionally-used interlayer insulating layer. A contact hole 52 is formed in the first interlayer insulating layer 50 so as to expose a portion of the second impurity region 44. Then the contact hole 52 is filled with a conductive plug 54.

Figure 16:
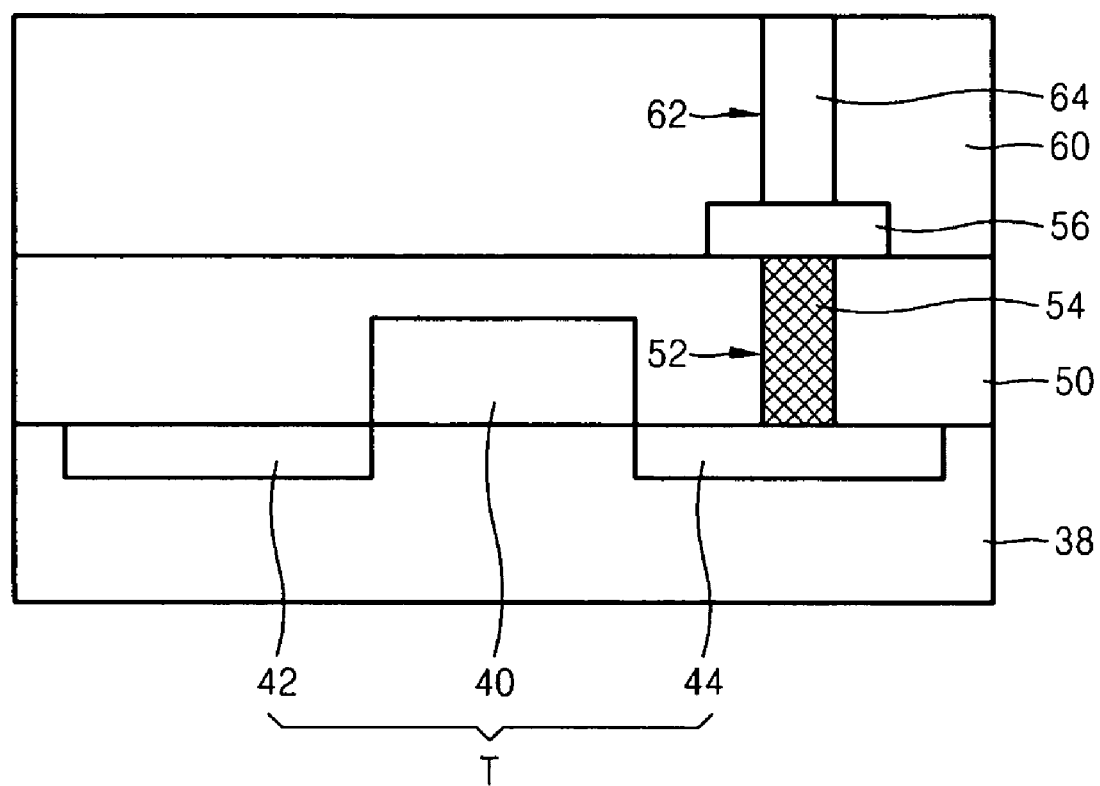

Referring to FIG. 16, a lower electrode 56 is formed on the first interlayer insulating layer 50 so as to cover the conductive plug 54. The conductive plug 54 and the lower electrode 56 may be formed of the same material. Alternatively, the conductive plug 54 and the lower electrode 56 may be formed at the same time. In other words, a material may be filled in the contact hole 52 so as to simultaneously form the lower electrode 56 and the conductive plug 54. A second interlayer insulating layer 60 is formed on the first interlayer insulating layer 50 so as to cover the lower electrode 56. The second interlayer insulating layer 60 may be a silicon oxide layer or a silicon nitride layer. The first and second interlayer insulating layers 50 and 60 may be formed of the same material. A via hole 62 is formed in the second interlayer insulating layer 60 so as to expose a portion of an upper surface of the lower electrode 56. The via hole 62 is filled with a conductive plug 64. The contact plug 64 is a lower electrode contact layer that is formed in order to connect the lower electrode 56 to a phase change layer to be formed later. The conductive plug 64 may be formed of any one of a chalcogenide layer, a conductive transition metal layer, a transition metal nitride layer, a silicide layer, a ternary nitride layer, and a transition metal oxide layer. The chalcogenide layer may be any one of a Ge—Sb—Te—N layer, a As—Sb—Te—N layer, a As—Ge—Sb—Te—N layer, a Sn—Sb—Te—N layer, a (group-5A element)-Sb—Te—N layer, a (group-6A element)-Sb—Te—N layer, a (group-5A element)-Sb—Se—N layer, and a (group-6A element)-Sb—Se—N layer.

Figure 17:
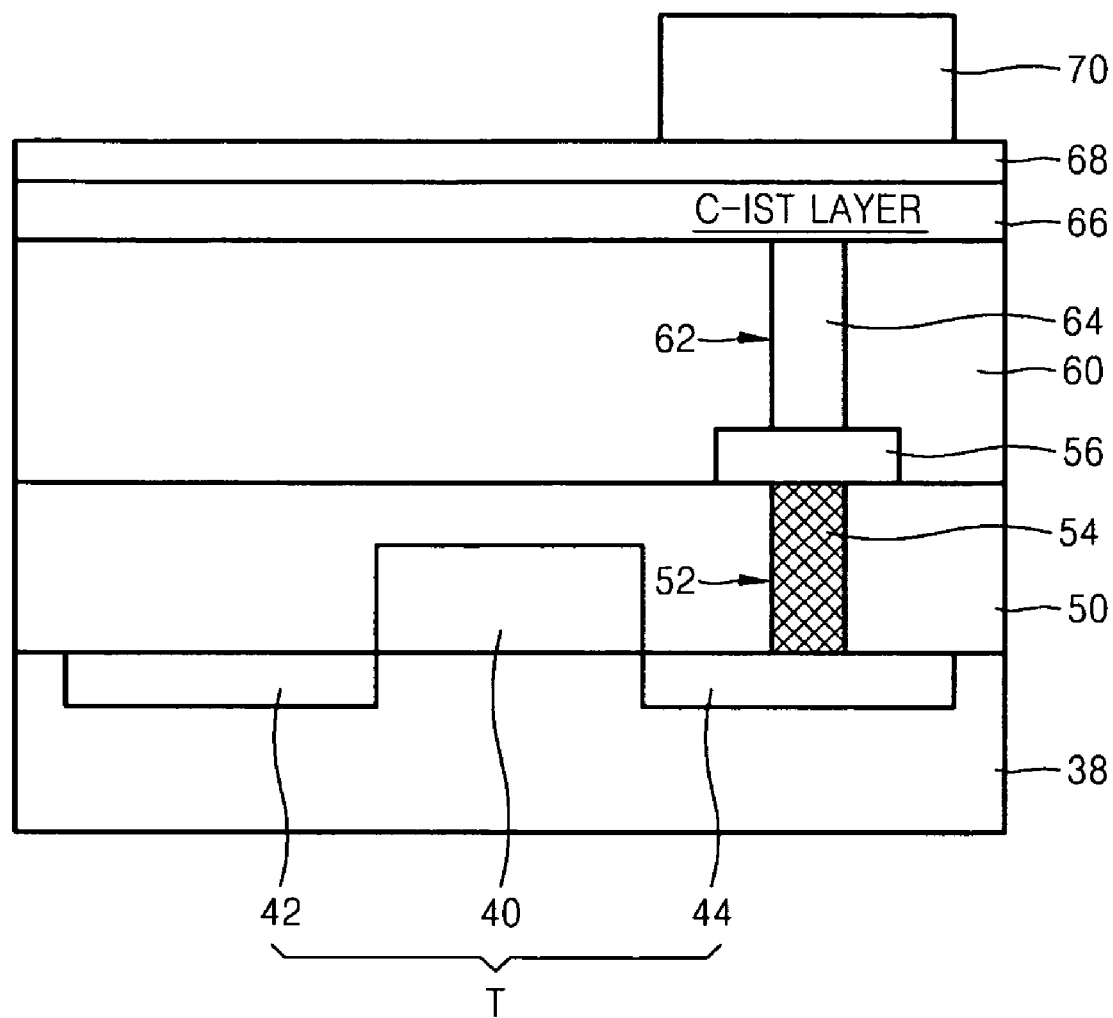

Referring to FIG. 17, a phase change layer 66 is formed on the second interlayer insulating layer 60 so as to cover the conductive plug 64. If the second interlayer insulating layer 60 is a silicone nitride layer, an adhesive layer may be additionally formed between the second interlayer insulating layer 60 and the phase change layer 66 in order to firmly adhere the phase change layer 66 to the second interlayer insulating layer 60. The phase change layer 66 may be formed of a C-IST layer. Here, the C-IST layer may contain additional elements and may carbide instead of C. Technical features such as a manufacturing method of the C-IST layer, ad the case of the C-IST layer containing additional elements and/or carbide instead of C are described above with reference to FIG. 1 and detailed descriptions thereof will be omitted here. An upper electrode 68 is formed on the phase change layer 66. A diffusion barrier layer (not shown) may be additionally formed between the upper electrode 68 and the phase change layer 66. The diffusion barrier layer prevents impurities such as titanium (Ti) to be diffused from the upper electrode 68 to the phase change layer 66. For example, the upper electrode 68 may be formed of titanium nitride (TiN). A photosensitive film pattern 70 is formed on the upper electrode 68 so as to define a storage node. The upper electrode 68 and the phase change layer 66 are sequentially etched using the photosensitive film pattern 70 as an etching mask and then the photosensitive film pattern 70 is removed. As a result, a PRAM including a C-IST layer as a phase change layer, according to the present invention, is manufactured as illustrated in FIG. 18.

Operations of a memory device according to the present invention will now be described with reference to FIG. 18.

Figure 18:
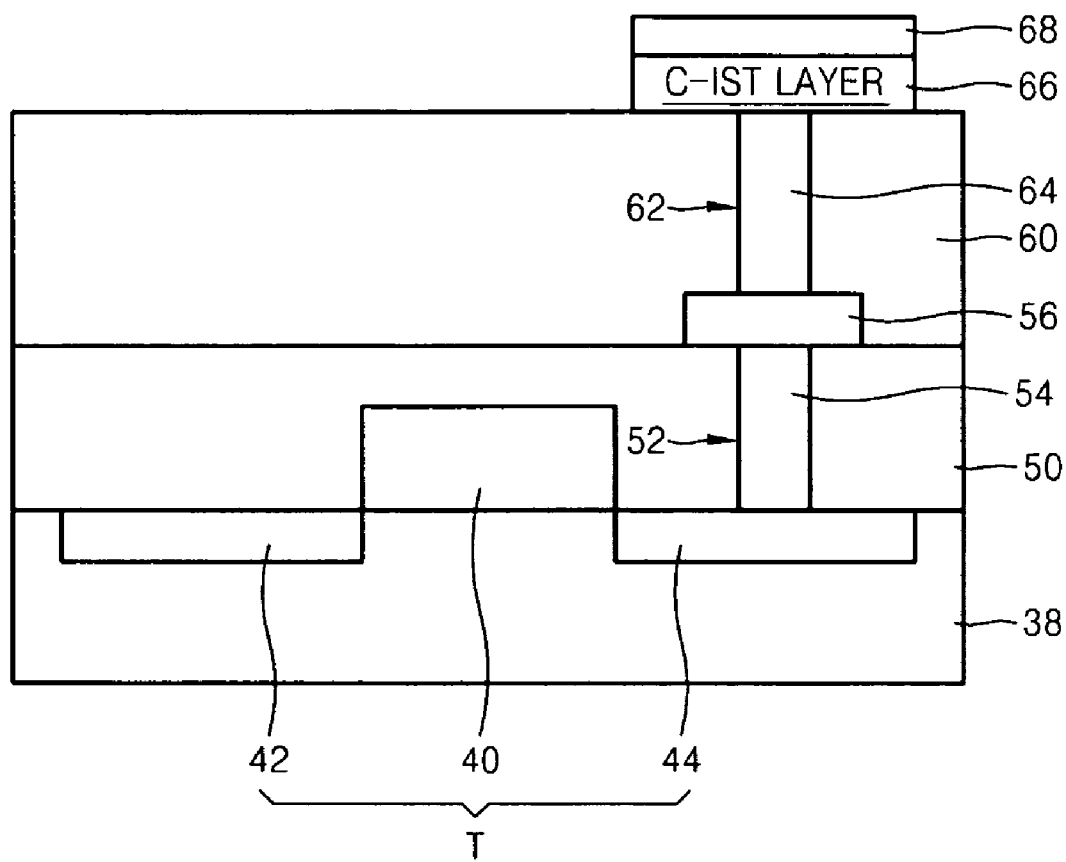

Referring to FIG. 18, the transistor T is maintained in a turned-on state. An operating voltage is applied between the upper electrode 68 and the first impurity region 42. The operating voltage may be a write voltage for recording data in the phase change layer 66.

If the operating voltage is the write voltage, due to the operating voltage, an Ireset is applied to the phase change layer 66 and an amorphous region is formed in the phase change layer 66. Accordingly, it is regarded that a data value "1" is recorded in the phase change layer 66.

The operating voltage may be a read voltage for reading data recorded in the phase change layer 66. If the operating voltage is the read voltage, a resistance of the phase change layer 66 may be measured and then the measured resistance may be compared to a reference resistance. If the measured resistance is lower than the reference resistance, it is regarded that the phase change layer 66 is in a crystalline state and that a data value "0" is read from the phase change layer 66.

On the other hand, if the measured resistance is higher than the reference resistance, it is regarded that the phase change layer 66 is in an amorphous state and that a data value "1" is read from the phase change layer 66. However, the present invention is not limited thereto, and the data values may be arbitrarily set when comparing the measured resistance and the reference resistance.

The operating voltage may be an erase voltage for erasing data recorded in the phase change layer 66. If the operating voltage is the erase voltage, due to the operating voltage, an Iset is applied to the phase change layer 66. Accordingly, the amorphous region on the phase change layer 66 is changed into a crystalline region such that a whole region of the phase change layer 66 is in a crystalline state.

According to the above embodiments of the present invention, as a phase change layer, a storage node of a memory device may be maintained to be a single phase and may be a C-IST layer having a higher Tc than a GST layer and a lower Tm than the GST layer. Thus, the memory device may have thermal stability and may not be affected by cell disturbance occurring due to heat. Also, due to a low Tm, Ireset may be lowered. Furthermore, due to a large difference between the resistance in a crystalline state and the resistance in an amorphous state of the C-IST layer, a sensing margin may be increased.

While the present invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. For example, one of ordinary skill in the art can variously change the structure of FIGS. 1 and 18. Therefore, the scope of the invention is defined not by the detailed description of the invention but by the appended claims, and all differences within the scope will be construed as being included in the present invention.

What is claimed is:

1. A phase change material containing a main compound and an additive, wherein the main compound is indium-antimony-tellurium (IST) and the additive comprises carbon (C).

2. The phase change material of claim 1, wherein a content a of the carbon (C) is $0.005 \leqq a \leqq 0.30$ atomic (at) %.

3. The phase change material of claim 1, wherein the additive further comprises nitrogen (N), oxygen (O), boron (B), or a transition metal.

4. The phase change material of claim 1, wherein the additive comprises carbide instead of the carbon (C).

5. The phase change material of claim 1, wherein the indium (In) is replaced by a Group-3 element.

6. The phase change material of claim 1, wherein the antimony (Sb) is replaced by a Group-5 element.

7. The phase change material of claim 1, wherein the tellurium (Te) is replaced by a Group-6 element.

8. The phase change material of claim 1, wherein the amount of the carbon (C) is such that the phase change material is maintained to be a single phase.

9. The phase change material of claim 3, wherein the additive comprises carbide instead of the carbon (C).

10. A memory device comprising:
    a switching device; and
    a storage node connected to the switching device,
    wherein the storage node comprises the phase change material of claim 1.

11. The memory device of claim 10, wherein a content of the carbon (C) in the additive is $0.005 \leq a \leq 0.30$ atomic (at) %.

12. The memory device of claim 10, wherein the additive further comprises one of nitrogen (N), oxygen (O), boron (B), and a transition metal.

13. The memory device of claim 10, wherein the indium (In) is replaced by a Group-3 element.

14. The memory device of claim 10, wherein the antimony (Sb) is replaced by a Group-5 element.

15. The memory device of claim 10, wherein the tellurium (Te) is replaced by a Group-6 element.

16. The memory device of claim 10, wherein the storage node comprises:
    a lower electrode connected to the switching device;
    a lower electrode contact layer on the lower electrode;
    a phase change layer including the phase change material covering an upper surface of the lower electrode contact layer; and
    an upper electrode which on the phase change layer.

17. The memory device of claim 16, further comprising a diffusion barrier layer between the upper electrode and the phase change layer.

18. A method of operating the memory device of claim 10, the method comprising:
    turning on the switching device; and
    applying an operating voltage to the storage node.

19. The method of claim 18, wherein the operating voltage is any one of a data write voltage, a data read voltage, and a data erase voltage.

* * * * *